United States Patent [19]
Yasuda

[11] Patent Number: 5,699,398
[45] Date of Patent: Dec. 16, 1997

[54] COUNTING APPARATUS

[75] Inventor: Yukio Yasuda, Tokyo, Japan

[73] Assignee: Mitsubishi Denki Kabushiki Kaisha, Tokyo, Japan

[21] Appl. No.: 675,259

[22] Filed: Jul. 3, 1996

[30] Foreign Application Priority Data

Jan. 8, 1996 [JP] Japan ................. P8-000708

[51] Int. Cl.⁶ ............................................. H03K 25/00
[52] U.S. Cl. ............................................. 377/94; 377/26
[58] Field of Search ............................. 377/26, 94

[56] References Cited

U.S. PATENT DOCUMENTS 4,740,915   4/1988   Bonitz et al. ..................... 377/26

FOREIGN PATENT DOCUMENTS

| 55-105895 | 8/1980  | Japan . |
| 62-45059  | 2/1987  | Japan . |
| 1-189977  | 7/1989  | Japan . |
| 2-53300   | 2/1990  | Japan . |
| 2-98898   | 4/1990  | Japan . |
| 4-196166  | 7/1992  | Japan . |
| 5-175447  | 7/1993  | Japan . |
| 5-218327  | 8/1993  | Japan . |
| 5-266682  | 10/1993 | Japan . |
| 5-290591  | 11/1993 | Japan . |
| 6-44793   | 2/1994  | Japan . |

*Primary Examiner*—Margaret Rose Wambach

[57] ABSTRACT

A counting circuit including destructive memory elements detection circuits for detecting whether the memory elements are broken, and control circuits for controlling the supply of a break current to the memory elements in a plurality of stages. A current feed circuit supplies the break current for breaking the memory elements in the counting circuit every time a to-be-counted write pulse is input. The control circuit in each stage of the counting circuit supplies the break current from the current feed circuit to the memory element of the stage based on a detection result of the detection circuit only when the memory element of the stage is unbroken while the memory element of a stage preceding the memory element is broken. The control circuit of the first stage supplies the break current to the memory element of the first stage when the memory element of the first stage is unbroken.

18 Claims, 5 Drawing Sheets

COUNTING APPARATUS

BACKGROUND OF THE INVENTION

1. Field of the Invention

The present invention relates to a counting apparatus using writable nonvolatile memory elements, and more particularly to a counting apparatus to be used in automobiles or the like under severe conditions, for example, temperature conditions or electric conditions.

2. Description of the Prior Art

A counted value is held in a counting apparatus using writable nonvolatile memory elements even when the supply of electricity is stopped in the middle of counting. Further, counting is resumed from a state immediately before the stop when the power supply is resumed (this type of apparatus will be referred to as a "nonvolatile counting apparatus" hereinafter). An exemplary nonvolatile counting apparatus includes a combination of EEPROMs (electrically erasable and programmable ROMs) as memory elements and a microcomputer. The EEPROMs used as memory elements hold data by accumulating electric charges at a floating gate electrically insulated by a considerably high insulating resistance.

When such a memory element as described above is used, for instance, at an engine of an automobile, stored data sometimes disappears from the memory element due to an electric stress, e.g., a surge or similar occurrence applied to the memory element because of a wide range of operating temperatures. As a result, the conventional counting apparatus using the memory elements described above cannot be used in an environment, such as an automobile engine, due to the temperature conditions or electrical conditions present therein.

There is also a destructive memory element used as the writable nonvolatile memory element, in addition to the above memory element using the floating gate. The destructive memory element is a memory element where data is written and held by electrically breaking a wiring, fusing the wire with a laser beam, or breaking and permanently short-circuiting a semiconductor PN junction with of a current. The destructive memory element can retain data even under the poor temperature and electrical surroundings described above. However, all destructive memory elements are designed to write and read specific data, and therefore cannot be incorporated directly into a conventional counting apparatus.

SUMMARY OF THE INVENTION

The object of the present invention is therefore to provide a nonvolatile counting apparatus which has a high reliability to operate correctly even under poor conditions, thereby eliminating the above problems.

According to a first aspect, the present invention is directed to a counting apparatus for counting a number of input write signals, comprising:

a first unit circuit comprising
  a first memory element for holding one-bit data of a first level when said memory element is in a broken state and a second level when said memory element is in an non-broken state, and
  detecting means for detecting whether said first memory element is broken or unbroken;
a second unit circuit comprising
  a second memory element for holding one-bit data of a first level when said memory element is in a broken state and a second level when said memory element is in an non-broken state, and
  detecting means for detecting whether said second memory element is broken or unbroken; and
breaking means for breaking one of said memory elements every time a write signal is input, so that, based on the detection result by said detecting means, the first memory element is broken when the first memory element is in the non-broken state, and the second memory element is broken when the first memory element is in the broken state.

As described above, the memory element of the first unit circuit is broken when the first write signal is input, and the memory element of the second unit circuit is broken when the second write signal is input. It is known that two write signals have been input when the detecting means detects the breaking of the memory element of the second unit circuit.

According to a second aspect, the present invention is directed to the counting apparatus of the first aspect, wherein said each memory element is a memory element which is to be broken by the supply of a predetermined current, said each breaking means including i) current feed means for feeding a current only for a predetermined time every time the write signal is input, ii) first control means for controlling the supply of the current to the first memory element from the current feed means, such that based on the detection result by the detecting means of the first unit circuit, the predetermined current is supplied to the first memory element only when the first memory element is unbroken, and iii) second control means for controlling the supply of the current to the second memory element from the current feed means, such that based on the detection results by the detecting means of the first and the second unit circuits, the predetermined current is supplied to the second memory element only when the first memory element is broken and the second memory element is unbroken.

As described above, every time the write signal is input, the current flows from the current feed means only for a predetermined time. The predetermined current is permitted to flow to the memory element of the first unit circuit when the first write pulse is input, and the current is permitted to flow to the memory element of the second unit circuit when the second write pulse is input. Accordingly, the memory elements are sequentially broken one by one every time the write signal is input.

According to a third aspect, the present invention is directed to the counting apparatus of the second aspect, wherein the current feed means includes a capacitor and charging means for accumulating a predetermined amount of electric charge into the capacitor, so that the capacitor accumulating the predetermined amount of charge feeds the current every time the write signal is input.

Because of is arrangement, by accumulating a suitable amount of charge in the capacitor, only one memory element is broken through one inputting of the write signal even if the write signal continues for a long time, whereby a continuous break of the memory elements is prevented.

According to a fourth aspect, the present invention is directed to the counting apparatus of the second aspect, further comprising current feed detecting means for detecting the supply of the current from the current feed means, and detection control means for stopping, based on the detection result by the current feed detecting means, the operation of all of the detecting means in the apparatus until the current supply is stopped after the current supply from the current feed means is started.

As directed above, the operation of all the detecting means is stopped when the current supply from the current feed means is started. The current continues to be supplied to the memory element to which the predetermined or more amount of current has been fed, whereas the memory elements to which the current has not been supplied continue to not be supplied. Even after the memory element receiving the current is broken, the memory elements are still not supplied. Thereafter, when the current supply by the current feed means is stopped, the detecting means in each unit circuit starts again to detect whether the memory element of the unit circuit is broken.

According to a fifth aspect, the present invention is directed to the counting apparatus of the second aspect, further comprising element current detecting means for detecting a sum of currents flowing in each of the memory elements when a predetermined voltage is applied to each of the memory elements.

As described above, the number of memory elements in the broken state can be checked based on the detection result of the element current detecting means.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

First embodiment

Figure 1:
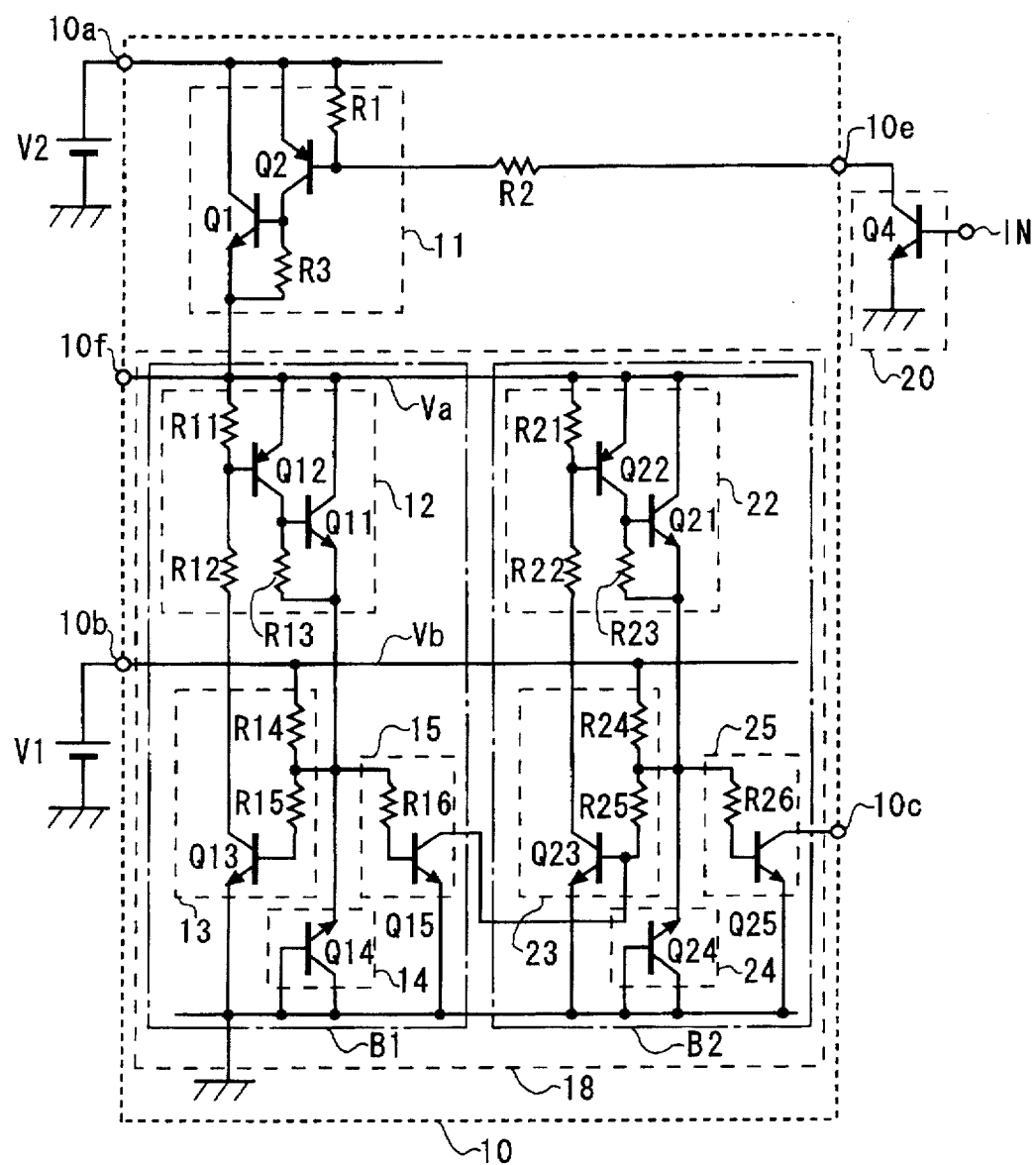
FIG. 1 is a circuit diagram showing a counting apparatus according to a first embodiment of the present invention.

FIG. 1 is a circuit diagram showing a counting apparatus according to a first embodiment of the present invention. The counting apparatus has an integrated circuit 10 of bipolar transistors having an input circuit 20 for receiving write pulses to be counted. The integrated circuit 10 produces a current in accordance with the write pulse. First and second power sources V1 and V2 are provided for supplying DC voltage to the integrated circuit 10. The integrated circuit 10 has a counting circuit 18 including blocks B1 and B2 for executing the counting operation, and a current feed circuit 11 for feeding a current ("break current" hereinbelow), in accordance with the write pulse, to a plurality of destructive memory elements 14, 24 in the blocks B1 and B2. The block B1 of the counting circuit 18 includes a destructive memory element 14, detection circuits 13 and 15 for detecting whether or not the memory element 14 is broken, and a control circuit 12 for controlling the supply of the break current to the memory element 14 depending on the detected result at the detection circuit 13. The block B2 has fundamentally the same structure as the block B1.

The input circuit 20 has an NPN transistor Q4 with an emitter thereof grounded. A collector of the NPN transistor Q4 is connected to a terminal 10e of the integrated circuit 10 and a base thereof is connected to an input terminal IN to which the write pulses are applied.

The current feed circuit 11 has an NPN transistor Q1, a PNP transistor Q2 and resistors R1, R2, R3. A base of the transistor Q2 is connected to the terminal 10e via the resistor R2. Since the terminal 10e is connected with the collector of the transistor Q4 of the input circuit 20, the transistor Q2 is maintained in the ON state while a "High" signal is supplied to the input terminal IN, that is, while the write pulse continues. When the transistor Q2 is turned ON, the current flows from a collector of the transistor Q2 to a base of the transistor Q1, whereby the transistor Q1 is turned ON as well. Accordingly, during the time while the write pulse continues, the break current flows to the blocks B1 and B2 of the counting circuit 18 through the transistors Q1 and Q2 from the second power source V2 connected to a terminal 10a. The current feed circuit 11 uses the above two transistors Q1 and Q2, because one transistor is not sufficient to supply enough current to break the memory element. The resistors R1 and R3 are leak cut resistors to transistors Q2 and Q1, respectively. Each transistor Q1 and Q2 is prevented from being erroneously turned ON by a leak current or the like generated at a junction of the collector and the base while the transistor is in the OFF state.

The memory element 14 in the block B1 of the integrated circuit 10 has an NPN transistor Q14. The NPN transistor Q14 has its base and collector grounded so as to serve as a Zener diode between the emitter and the ground. Since the emitter and the base of the NPN transistor Q14 are connected by a PN junction, the breakdown voltage of which is the lowest in the bipolar integrated circuit. The counting apparatus of the first embodiment uses the Zener diode as the destructive memory element. It is noted that the Zener diode used as a destructive memory element may be obtained not only by the junction of the emitter and the base, but also by other PN junctions, for example, a PN junction formed separately from the transistor in the bipolar integrated circuit.

When a predetermined or larger amount of current flows between the emitter and the base of the transistor Q14 (the Zener diode) as the memory element of the counting apparatus, a Zener voltage is generated. The Zener voltage is determined by a concentration of impurities of a semiconductor forming the PN junction of the emitter and the base, and consequently causes a power loss determined by the Zener voltage and the current flowing in the PN junction. The power loss causes a rapid temperature rise at the PN junction, and eventually breaks the PN junction due to the abnormal heat. A resistance of the broken PN junction is as low as several ohms, and is permanently retained. That is, the broken PN junction is similar to a shortcircuited state, and the shortcircuited state is maintained permanently once the PN junction is broken. The PN junction before being broken, however, shows a considerably high-impedance when it is reverse-biased. Accordingly, the Zener diode formed by transistor Q14 functions as a nonvolatile memory element holding one-bit of data by placing the PN junction of the emitter and base either in a high-impedance state or in a shortcircuited state, namely, either in a non-broken or broken state.

The first detection circuit 13 of the block B1 has an NPN transistor Q13 and resistors R14 and R15, while the second detection circuit 15 of the block B1 has an NPN transistor Q15 and a resistor R16. A base of the transistor Q13 of the first detection circuit 13 is connected to the emitter of the transistor Q14 via the resistor R15. Therefore, when the PN junction of the emitter and the base of the transistor Q14 constituting the memory element 14 is broken and the shortcircuited state is, the base of the transistor Q13 is grounded. The transistor Q13 of the first detection circuit 13 will never be turned ON when the memory element 14 is in the broken state. Further, since the base of transistor Q15 of the second detection circuit 15 is also connected to the emitter of the transistor Q14 via the resistor R16, the transistor Q15 of the second detection circuit 15 will also never be turned ON if the memory element 14 is in the broken state. Meanwhile, if the PN junction of the emitter and base of the transistor Q14 is in the state of a high-impedance, that is in the non-broken state, the current flows to the base of the transistor Q13 from the first power source V1 through the resistors R14 and R15. Therefore, in the case where the memory element 14 is unbroken, the transistor Q13 of the first detection circuit 13 is in the ON state, and the transistor Q15 of the second detection circuit 15 is likewise in the ON state.

The control circuit 12 of the block B1 has an NPN transistor Q11, a PNP transistor Q12 and resistors R11, R12 and R13. The resistors R11 and R13 are leak cut resistors for the transistors Q12 and Q11, respectively. Similar to the current feed circuit 11, each of the transistors Q12 and Q11 is prevented from being erroneously driven by a leak current or the like generated at a junction between its collector and base. The base of the transistor Q12 is connected to a collector of the transistor Q13 of the first detection circuit 13 via the resistor R12. Thus, when the transistor Q13 is in the ON state, the current at the base of the transistor Q12 flows to the transistor Q13. Thus, the transistor Q12 turns ON, and also the transistor Q11, having its base connected with the collector of the transistor Q12, turns ON. The resistor R12 determines the current at the base of the transistor Q12 at this time. The base current is determined by the resistance of resistor R12 and a potential at the emitter of the transistor Q1 of the current feed circuit 11. When the transistors Q11 and Q12 turn ON, the break current flows from the current feed circuit 11 to the transistor Q14 constituting the memory element 14 of the block B1. On the other hand, when the transistor Q13 of the first detection circuit 13 is in the OFF state, both transistors Q11 and Q12 are turned OFF, cutting the current supply from the current feed circuit 11. As a result, the break current will not flow through the memory element 14 of the block B1.

In this manner, the current is supplied to the counting circuit 18 by the current feed circuit 11 when the transistor Q4 of the input circuit 20 is turned ON upon receipt of the write pulse, and the transistor Q13 of the first detection circuit 13 is turned ON if the memory element 14 of the block B1 is unbroken, whereby the transistors Q11 and Q12 of the control circuit 12 are turned ON. Consequently, the break current is supplied to the transistor Q14 constituting the memory element 14. On the contrary, if the memory element 14 of the block B1 is broken, the transistor Q13 of the first detection circuit 13 is turned OFF, thereby bringing the transistors Q11 and Q12 into the OFF state. Accordingly, the break current is not supplied to the transistor Q14 constituting the memory element 14.

The block B2 in the integrated circuit 10 which is substantially the same as the above-described block B1 has a memory element 24 including an NPN transistor Q24, a first detection circuit 23 including a transistor Q23 and resistors R24 and R25, a second detection circuit 25 including an NPN transistor Q25 and a resistor R26, and a control circuit 22 including an NPN transistor Q21, a PNP transistor Q22 and resistors R21–R23. The block B2 is different from the block B1 in that a base of the transistor Q23 of the first detection circuit 23 is connected to a collector of the transistor Q15 of the block B1. As described above, the transistor Q15 is turned ON when the memory element 14 of the block B1 is unbroken, and turned OFF when the memory element 14 is broken. Therefore, in the broken state of the memory element 14 of the block B1, the transistor Q23 of the first detection circuit 23 of the block B2 is turned ON when the memory element 24 is not in the broken state, whereas the transistor Q23 is turned OFF when the memory element 24 is broken. The supply of the break current to the memory element 24 is controlled by the control circuit 22 depending on whether the transistor Q23 is in the ON state or OFF state. However, if the memory element 14 of the block B1 is unbroken, the transistor Q15 is turned ON thereby making the base of the transistor Q23 nearly equal to a ground potential, whereby the transistor Q23 is brought into the OFF state even when the memory element 24 of the block B2 is unbroken. Accordingly, so long as the memory element 14 of the block B1 is not in the broken state, the break current is not supplied to the memory element 24 of the block B2 at all even when the memory element 24 of the block B2 is unbroken.

A collector of the transistor Q25 of the second detection circuit 25 in the block B2 is connected to the terminal 10c of the integrated circuit 10. Whether the memory element 24 of the block B2 is broken or not is accordingly confirmed from outside of the integrated circuit 10 by checking whether or not the transistor Q25 is in the OFF state.

Now, a counting operation performed by the counting apparatus constructed as above will be discussed. In the counting apparatus of the first embodiment, since the to-be-counted write pulse is input through the input terminal IN to the base of the transistor Q4 of the input circuit 20, the transistor Q4 is turned ON when receiving the first write pulse. As a result, the transistors Q1 and Q2 of the current feed circuit 11 are turned ON to supply the break current to the blocks B1 and B2 of the counting circuit 18 from the current feed circuit 11.

Supposing that both memory elements 14 and 24 of the blocks B1 and B2 are in the non-broken state, the transistor Q13 of the first detection circuit 13 of the block B1 is turned ON, so that the transistors Q11 and Q12 of the control circuit 12 are turned ON. When the write pulse is input to the input circuit 20, in the block B1, the break current flows to the transistor Q14 through the control circuit 12 from the current feed circuit 11. Accordingly, the PN junction between the emitter and base of the transistor Q14 is broken into the shortcircuited state. In other words, the memory element 14 of the block B1 is brought into the broken state. In the meantime, the transistor Q23 of the first detection circuit 23 in the block B2 is kept OFF until the memory element 14 of the block B1 is broken. Therefore, the transistors Q21 and Q22 of the control circuit 22 in the block B2 are held in the OFF state, preventing the break current from being supplied to the transistor Q24. That is, the memory element 24 of the block B2 is maintained in the non-broken state. However, once the memory element 14 of the block B1 is broken, the transistor Q23 of the first detection circuit 23 of the block B2 is turned ON, so that the break current is sent to the transistor Q24 from the current feed circuit 11 if the transistor Q4 of the input circuit 20 is continuously held in the ON state even after the memory element 14 of the block B1 is broken.

Therefore, in the case where the to-be-counted write pulse continues for a long time, inputting of one write pulse may break both memory elements 14 and 24 of the blocks B1 and B2, with the result that the write pulse cannot be correctly counted. As such, a time required for breaking the memory element, i.e., a time required for breaking the PN junction between the emitter and the base of the NPN transistor having the collector and the base grounded is measured beforehand in the embodiment, and a width of the write pulse supplied to the input circuit 20 is set based on the measured time so that one memory element 14 is broken, but two memory elements are not broken.

Thereafter, when the second write pulse is input to the input circuit 20, with the memory element 14 of the block B1 held in the broken state and the transistor Q15 turned OFF, the transistor Q23 of the first detection circuit 23 of the block B2 is kept ON. Therefore, in the block B2, inputting of the second write pulse turns ON the transistors Q21 and Q22 of the control circuit 22, thereby to supply the break current to the transistor Q24. As a result, a PN junction of an emitter and a base of the transistor Q24 is broken and shortcircuited. In other words, the memory element 24 of the block B2 is broken. Since the memory element 14 is already in the broken state and the transistor Q13 of the first detection circuit 13 is kept OFF in the block B1 when the second write pulse is input, both transistor Q11 and Q12 of the control circuit 12 are in the OFF state. Therefore, the break current is not supplied to the memory element 14 of the block B1.

As described hereinabove, the memory element 14 of the block B1 is broken when the first write pulse is input and, the memory element 24 of the block B2 is broken when the second write pulse is input. It can be confirmed whether or not the memory element 24 of the block 2 is broken by checking from a terminal 10c of the integrated circuit 10 whether or not the transistor Q25 is OFF. The counting result can thus be read out.

Although the above-described counting apparatus shown in FIG. 1 is adapted to count two write pulses, it becomes possible to count more write pulses by connecting further circuits of the block B2 cascaded one after another. More specifically, it is possible to count n write pulses by connecting n−1 stages of circuits equal to the circuit of the block B2 to the block B1 as a first stage. The following description is directed to an example wherein many stages of circuits are connected to constitute the counting circuit 18. In this example, a collector of the transistor of the second detection circuit in a preceding stage is connected to a base of the transistor of the first detection circuit in each stage other than the first stage. Accordingly, as is understood from the foregoing description, the break current is never supplied to the memory element of each stage other than the first stage so long as the memory element in a stage preceding the subject stage is unbroken. Every time the write pulse is input, the memory elements are sequentially broken from the first stage to the last stage (nth block). The width of the write pulse input at this time is set, as described earlier, on the basis of the measured time necessary for breaking the memory element so as not to continuously break a plurality of memory elements. Therefore, only one memory element is broken every time the write pulse is input. When the memory element of the last stage is broken subsequent to inputting of the (n)th write pulse, this is read out from the terminal 10c to which the collector of the transistor of the second detection circuit of the last stage is connected. The fact that n write pulses are input to the counting apparatus is detected in this manner.

The counting apparatus according to the first embodiment of the present invention uses a destructive memory element.

Therefore, not only does the counted value not disappear when the power supply is stopped, but also the counted value is reliably retained even under bad temperature conditions or electric conditions, etc. As a result, the counting apparatus can count write pulses with good reliability.

Second embodiment

As described above, when the width of the write pulse input to the input circuit 20 becomes larger than a certain value in the counting apparatus of the first embodiment, the memory elements of a plurality of adjacent stages are successively broken by the input of one write pulse. As a result, the number of input write pulses differs from the number of broken memory elements, that is, the write pulses cannot be correctly counted. Under the circumstances, for preventing the erroneous counting (referred to as an "erroneous operation through continuous break" hereinbelow), a counting apparatus according to a second embodiment of the present invention employs a capacitor as a power source for storing electric charges to supply the break current, in place of the second DC power source V2.

Figure 2:
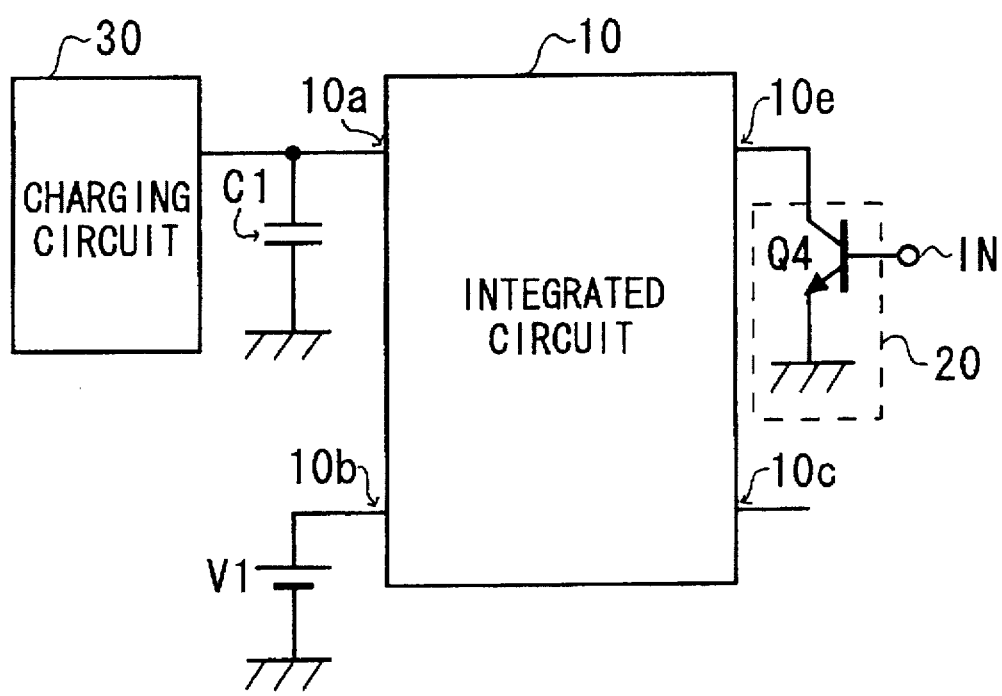
FIG. 2 is a circuit diagram showing a counting apparatus according to a second embodiment of the present invention.

FIG. 2 is a circuit diagram showing the counting apparatus in the second embodiment. One difference from the counting apparatus of the first embodiment is that one terminal of a capacitor C1, in place of the second power source V2, is connected to the terminal 10a of the integrated circuit 10, with the other terminal of the capacitor being grounded, and moreover, a charging circuit 30 is provided to charge the capacitor C1. All other elements are the same as in the first embodiment.

In the counting apparatus of the second embodiment, the charging circuit 30 accumulates charges in the capacitor C1 (charging of the capacitor C1) so as to supply a high voltage necessary to break the memory element before the write pulse is input to the input circuit 20. When the write pulse is supplied to the input circuit 20, the break current is sent to the memory element in the integrated circuit 10 from the capacitor C1, thereby breaking the memory element. At this time, the electric charges accumulated in the capacitor C1 are consumed in accordance with the break of the memory element, whereby a voltage of the capacitor C1 (potential at the terminal 10a) is decreased. An amount of accumulated charges in the capacitor C1 consumed when one memory element is broken is measured beforehand, so that the charging circuit 30 charges the capacitor C1 to accumulate the measured amount of charges before the write pulse is supplied to the input circuit 20.

In this arrangement, since the capacitor C1, acting as the power source to supply the break current, stores only the electric charge in an amount corresponding to the break of one memory element, even if the width of the write pulse supplied to the input circuit 20 is large, two or more memory elements are prevented from being broken by the inputting of one write pulse. Accordingly, the width of the write pulse is not necessary to be controlled and the number of write pulses can be correctly counted.

The charging circuit 30 is enough to store an electric charge in an amount corresponding to the break of one memory element after the write pulse is input to the input circuit 20 before a next write pulse is supplied. Therefore, the charging circuit 30 is not required to be highly efficient so long as a time interval of the write pulses supplied to the input circuit 20 is extraordinarily short. A low efficiency is rather suitable to prevent a plurality of memory elements from being successively broken consequent to the erroneous operation. A charge pump or similar circuit of low efficiency in current supply may be used as the charging circuit 30. In this case, if a voltage of the first power source V1 is adapted to be increased by the charging circuit 30 and applied to the capacitor C1, the necessary number of power sources can be reduced.

Third embodiment

The erroneous operation caused by the continuous break is prevented by controlling the width of the write pulse in the first embodiment and by controlling the amount of electric charge accumulated in the capacitor C1 as the break current power source in the second embodiment. In a third embodiment, the erroneous operation is avoided by controlling the supply of power to the detection circuits in each block of the counting circuit 18 in the integrated circuit 10.

Figure 3:
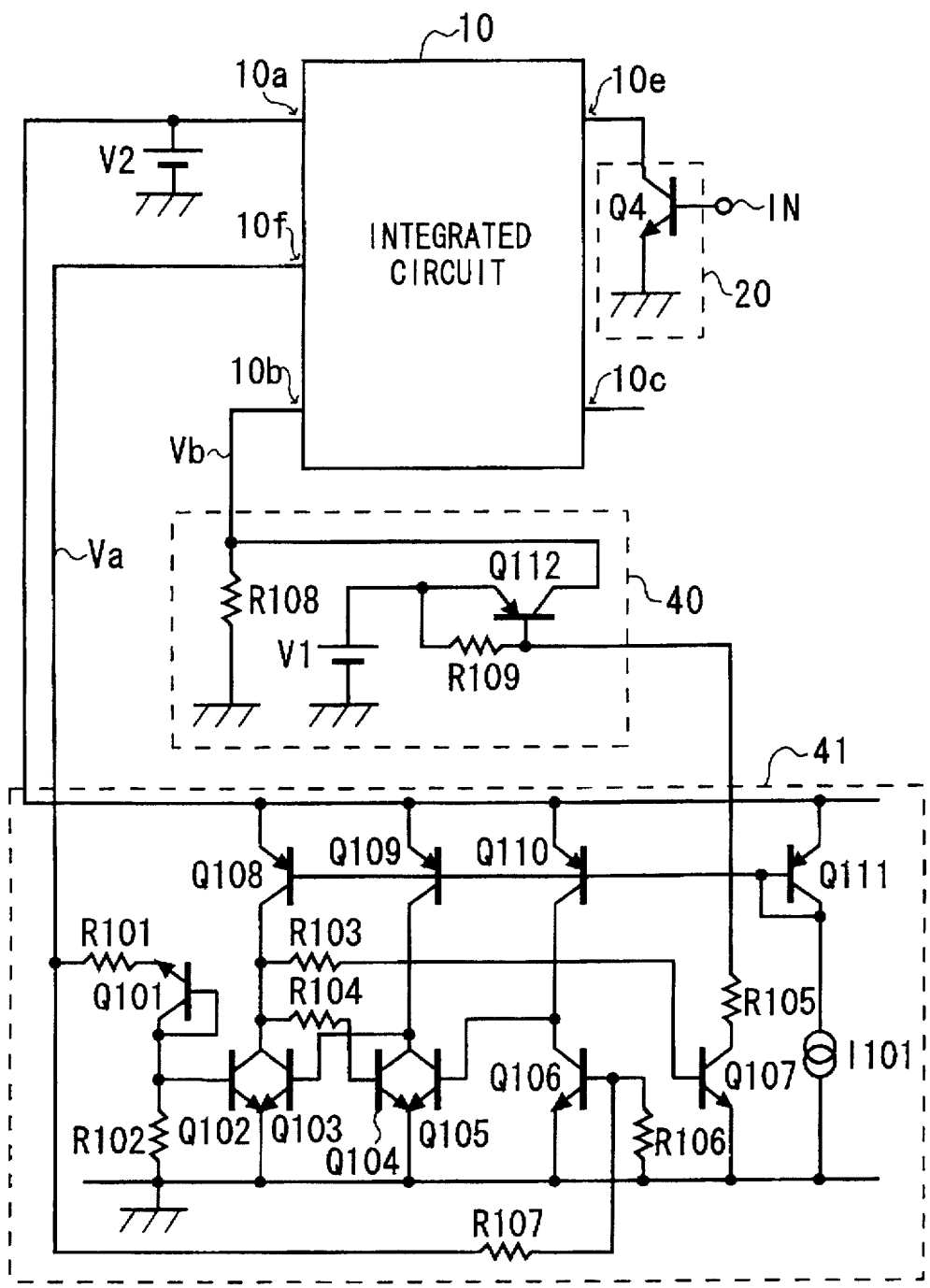
FIG. 3 is a circuit diagram showing a counting apparatus according to a third embodiment of the present invention.

FIG. 3 is a circuit diagram of a counting apparatus according to the third embodiment of the invention. The counting apparatus is provided with a current feed detecting circuit 41 which detects that the break current is supplied from the current feed circuit 11. Moreover, a control source circuit 40 for controlling the supply of power to each detection circuit within the integrated circuit 10 based on the detected result of the current feed detecting circuit 41 is connected to the terminal 10b of the integrated circuit 1, instead of connecting the first power source V1 directly to the terminal 10b. The counting apparatus of the third embodiment is different from the counting apparatus of the first embodiment as set forth above. The integrated circuit 10 has a terminal 10f so as to detect from the outside a potential Va at a connecting point between each block of the counting circuit 18 and the current feed circuit 11, namely, a connecting point where the emitter of the transistor Q1 of the current feed circuit 11 is connected. The counting apparatus of the third embodiment is constructed in the same manner as a apparatus of as set forth first embodiment except the above.

The current feed detecting circuit 41 is obtained by connecting NPN transistors Q101–Q107, PNP transistors Q108–Q111, resistors R101–R107 and a constant current source I101 as indicated in FIG. 3. In the current feed detecting circuit 41, a base and a collector of the transistor Q101 are connected thereby to constitute a Zener diode to detect an increase of the potential Va. The transistors Q102–Q105, Q108 and Q109 and the resistor R104 construct a flip-flop. Moreover, the transistor Q111 having its collector connected to the constant current source I101 forms a current mirror circuit along with the transistors Q108–Q110. The supply of the break current within the integrated circuit 10 is detected by the current feed detecting circuit 41 via the terminal 10f, based on which the transistor Q107 is turned ON or OFF.

The control source circuit 40 is formed by connecting the first power source V1, a PNP transistor Q112 and resistors R108 and R109 as shown in FIG. 3. The transistor Q112 in the control source circuit 40 controls whether the power of the first power source V1 is to be supplied or not, having its base connected with a collector of the transistor Q107 of the current feed detecting circuit 41 via the resistor R105. The resistor R108 is a resistor for cutting a leak current, determining a voltage Vb of the terminal 10b when the transistor Q112 is in the OFF state. The power supply from the first power source V1 to the terminal 10b of the integrated circuit 10 is controlled by the thus-constituted control source circuit 40 depending on whether the transistor Q107 of the current feed detecting circuit 41 is ON or OFF.

FIGS. 4A–4G indicate signal waveforms representing the operation of the counting apparatus of the third embodiment.

When the write pulse is not input to the input circuit 20 in the instant counting apparatus, the transistor Q4 of the input circuit 20 is in the OFF state. Since the transistors Q1 and Q2 of the current feed circuit 11 in the integrated circuit 10 are also in the OFF state when the transistor Q4 is turned OFF, the current is never supplied to the current feed detecting circuit 41 from the terminal 10f. At this time, the base potential at the transistors Q102 and Q106 is zero in the current feed detecting circuit 41, and therefore the transistors Q102 and Q106 are brought in the OFF state. When the transistor Q106 is OFF, the transistor Q105 is turned ON because of the supply of the base current from the transistor Q110. With the transistor Q105 in the ON state, the transistor Q103 is turned OFF. As the transistors Q102 and Q103 are both turned OFF, the base current is supplied to the transistor Q107 from the transistor Q108 through the resistor R103, whereby the transistor Q107 is turned ON and eventually the transistor Q112 of the control source circuit 40 is turned ON. Therefore, when the write pulse is not supplied to the input circuit 20, the power of the first power source V1 is fed to the terminal 10b of the integrated circuit 10. The detection circuits in each block of the counting circuit 18 of the apparatus operate in the same manner in the integrated circuit 10 as in the first embodiment.

Figure 4:
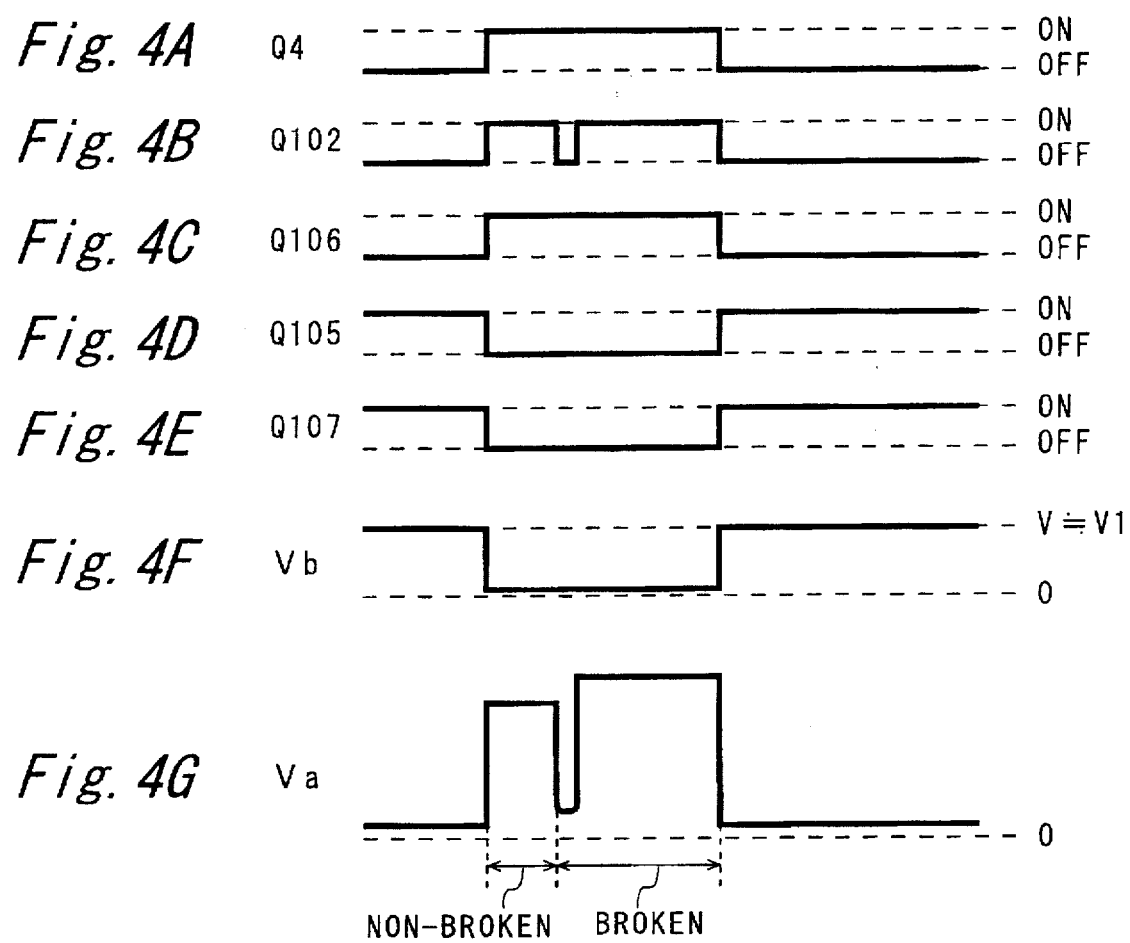
FIGS. 4A–4G show signal waveforms representing the operation of the counting apparatus of the third embodiment.

Subsequently, when the write pulse is input to the input circuit 20, the break current is supplied to one memory element determined by the detected results at the detection circuits. Specifically, when the memory element 14 in the first stage among a plurality of stages of blocks constituting the counting circuit 18 is unbroken, the break current is sent to the memory element 14 in the first stage. If the memory element 14 in the first stage is broken, the break current is supplied to the memory element of a stage which is unbroken while the memory element in the previous stage to the subject stage is broken. The description below is based on an assumption that the break current is supplied to the memory element 14 of the first stage. When the break current is supplied to the memory element 14, the potential Va of the terminal 10f is a sum of a Zener voltage and a voltage drop at the transistors Q11 and Q12 before the Zener diode consisting of the transistor Q14 is broken, i.e., 10V or so. Therefore, when the break current is started to be supplied, as shown in FIG. 4G, the potential Va of the terminal 10f is increased to approximately 10V, and the current is supplied from the terminal 10f to the current feed detecting circuit 41. As a result, the transistor Q106 is turned ON in the current feed detecting circuit 41 as shown in FIG. 4C. When the potential Va exceeds the Zener voltage of a Zener diode including the transistor Q101, the current flows to the Zener diode, thereby turning ON the transistor Q102.

The transistor Q105 is turned OFF as shown in FIG. 4D when the transistor Q106 is turned ON, while the transistor Q104 is turned OFF when the transistor Q102 is turned ON. If both transistors Q104 and Q105 are turned OFF as above, the transistor Q103 receives the base current from the transistor Q109 thereby to be turned ON. As a result, the transistor Q107 having its base connected to a collector of the transistor Q103 via the resistor R103 is turned OFF as shown in FIG. 4E. When the transistor Q107 is turned OFF, the transistor Q112 of the control source circuit 40 is turned OFF as well. Accordingly, when the write pulse is input to the input circuit 20 and the supply of the break current is started, the power supply to the terminal 10b of the integrated circuit 10 is cut. The potential Vb at the terminal 10b on this occasion is approximately 0V as shown in FIG. 4F because of the resistor R108 connected between the terminal 10b and the ground.

Even if the power supply to the terminal 10b is cut in the above manner, the base current from the control circuit 12 is continuously fed via the resistor R15 to the transistor Q13 of the first detection circuit 13 in the block B1 (first stage) of the counting circuit 18 in the integrated circuit 10 until the memory element 14 is broken, so that the transistor Q13 is kept ON. The supply of the break current to the memory element 14 is hence continued. In contrast, the current is never supplied to the first detection circuit from the control circuits in the blocks other than the block of the first stage of the counting circuit 18, and therefore, the transistor of the first detection circuit is maintained in the OFF state. The break current is never supplied to the memory elements in the blocks other than the block of the first stage so long as the power supply to the terminal 10b is cut.

Then, when the memory element 14 is broken, the PN junction of the base and emitter of the transistor Q14 is shortcircuited. In consequence of this, the potential Va at the terminal 10f becomes merely an amount of the voltage drop at the transistors Q11 and Q12 in the ON state. However, the transistor Q13 of the first detection circuit 13 is brought in the OFF state thereby to turn OFF the transistors Q11 and Q12 of the control circuit if the memory element 14 is broken, whereas the transistors Q1 and Q2 of the current feed circuit 11 are kept ON at this time. Therefore, the potential Va decreased to the amount of the voltage drop is increased again as shown FIG. 4G.

When the potential Va of the terminal 10f is lowered to the amount of the voltage drop immediately after the memory element 14 is broken, the current does not flow through the Zener diode of the transistor Q101 in the current feed detecting circuit 41, whereby the transistor Q102 is turned OFF as in FIG. 4B. However, the current is supplied to the current feed detecting circuit 41 through the terminal 10f from the current feed circuit 11 while the transistor Q4 of the input circuit 20 is kept ON (while the write pulse continues) even when the potential Va of the terminal 10f is decreased, and therefore the transistor Q106 is maintained in the ON state as shown in FIGS. 4A, 4C. The state of the flip-flop in the current feed detecting circuit 41 is not changed. In other words, the transistors Q104 and Q105 are kept OFF and the transistor Q103 is kept ON by the memory function of the flip-flop even if the potential Va is decreased. Accordingly, the transistor Q107, eventually the transistor Q112 of the control source circuit 40 is continuously held in the OFF state, whereby the power supply to the terminal 10b remains cut.

After the memory element 14 is broken, the transistors Q102 and Q106 are in the ON state before the transistor Q4 of the input circuit 20 is turned OFF after the rise of the potential Va of the terminal 10f (before the write pulse is finished) as shown in FIGS. 4A, 4B and 4C, similar to the time before the memory element 14 is broken after the write pulse is supplied. The state of the flip-flop is not changed either during this time, with the transistors Q104 and Q105 being in the OFF state as shown in FIG. 4D and the transistor Q103 in the ON state. Accordingly, the transistor Q107 is kept in the OFF state and the transistor Q112 of the control source circuit 40 is continuously held OFF. The power supply to the terminal 10b is still cut.

Thereafter, when the transistor Q4 of the input circuit 20 becomes turned OFF (the write pulse is completed), the transistors Q1 and Q2 of the current feed circuit 11 in the integrated circuit 10 are turned OFF (referring to FIG. 1), thereby to stop the supply of current to the current feed detecting circuit 41 from the terminal 10f. The transistors Q102 and Q106 are thus turned OFF. The turning-OFF of the transistor Q106 turns ON the transistor Q105, resulting in turning-OFF of the transistor Q103. When both the transistor Q102 and the transistor Q103 are brought into the OFF state, the base current is supplied to the transistor Q107 via the resistor R103 from the transistor Q108, thereby turning the transistor Q107 ON. Consequently, the transistor Q112 of the control source circuit 40 is turned ON, and the supply of current to the terminal 10b of the integrated circuit 10 is started again.

Hence, the same operation is repeated by the current feed detecting circuit 41 and the control source circuit 40 every time the write pulse is input to the input circuit 20. The memory elements are sequentially broken one by one in the integrated circuit 10 from the first stage to the last one every time the write pulse is input.

As described hereinabove, according to the counting apparatus of the third embodiment, while the transistor Q4 of the input circuit 20 is in the ON state, namely, while the to-be-counted write pulse continues, the state of the flip-flop in the current feed detecting circuit 41 is not changed after one memory element is broken, so that the power supply to the terminal 10b of the integrated circuit 10 from the control source circuit 40 is kept cut to thereby keep the transistor of the first detection circuit of each block of the counting circuit 18 in the OFF state. Therefore, the break current is not supplied to any of the memory elements. The memory elements are prevented from being successively broken while the write pulse continues, and only one memory element is broken every time one write pulse is input. At the same time, by setting the width of the input write pulse to be sufficiently longer than the time required for breaking one memory element, even if a breakdown voltage of the memory element is not uniform due to an irregularity of manufacturing conditions, etc., only one memory element is broken every time one write pulse is input. The counting apparatus can correctly count the write pulses even when the width of the write pulses or the breakdown voltage of the memory elements is irregular.

Fourth embodiment

The counting apparatuses of embodiments 1–3 described above detect whether a predetermined number is counted by confirming from the terminal 10c whether or not the memory element of the block in the last stage of a plurality of stages constituting the counting circuit 18 in the integrated circuit 10 is broken. Meanwhile, the total number of broken memory elements 14 in the counting apparatus can be detected by detecting the current fed to the integrated circuit 10 from the first power source V1 through the terminal 10b. A counting apparatus according to the fourth embodiment is equipped with such a circuit as above that detects the current supplied to the integrated circuit 10 through the terminal 10b.

Figure 5:
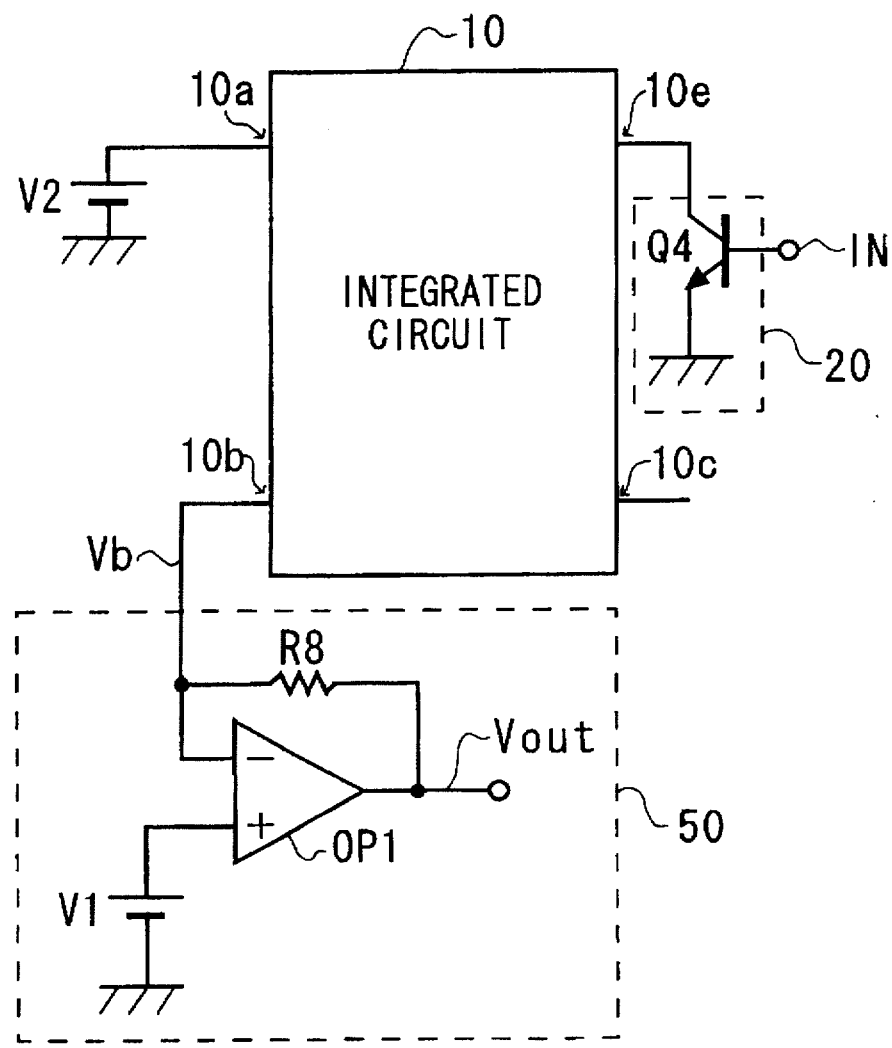
FIG. 5 is a circuit diagram showing a counting apparatus according to a fourth embodiment of the present invention.

FIG. 5 is a circuit diagram of the counting apparatus of the fourth embodiment of the present invention. Instead of connecting the first power source V1 directly to the terminal 10b of the integrated circuit 10, a current detection circuit 50 including of an operational amplifier OP1, a resistor R8 and the first power source V1 is connected to the terminal 10b. Although the counting apparatus of the fourth embodiment is different, as set forth above from the first embodiment, all other structure is the same as in the first embodiment.

In the current detection circuit 50, the first power source V1 is connected to a non-inverting input terminal of the operational amplifier OP1. An inverting input terminal of the operational amplifier OP1 is connected to the terminal 10b of the integrated circuit 10, and at the same time, connected to an output of the operational amplifier OP1 via the resistor R8. As set forth above, the same voltage V1 as in the first embodiment, etc. is applied to the terminal 10b to supply the current to the integrated circuit 10 through the terminal 10b from the output of the operational amplifier OP1. The supplied current flows through the resistor R8, and therefore an output voltage of the operational amplifier OP1 is a value corresponding to the supplied current. Since the supplied current is increased as more and more memory elements 14 are broken in the counting apparatus (referring to FIG. 1), the number of the broken memory elements 14 can be detected from the output voltage of the operational amplifier OP1.

When counting of a predetermined number is completed, all of the memory elements in the counting apparatus are in the broken state, which can be determined by confirming whether or not the memory element of the last stage is broken. Similar to the other embodiments, whether the memory element in the last stage is broken or not is detected by confirming from the terminal 10c whether the transistor of the second detection circuit of the final stage is in the OFF state or not. According to the fourth embodiment, therefore, whether the total memory elements 14 in the counting apparatus are broken, i.e., whether a predetermined number is completely counted is judged both by detecting the state of the memory element of the final stage and by detecting the number of memory elements in the broken state from the output voltage of the operational amplifier OP1. Since the completion of counting is double, counting reliability is improved in the fourth embodiment.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A counting apparatus for counting write signals, comprising:
 a first unit circuit including
  a first memory element for holding one-bit data of a first level when said first memory element is in a broken state and a second level when said first memory element is in a non-broken state, and
  first detecting means for detecting whether said first memory element is broken or unbroken;
 a second unit circuit including,
  a second memory element for holding one-bit data of the first level when said second memory element is in the broken state and the second level when said second memory element is in the broken state, and
  second detecting means for detecting whether said second memory element is broken or unbroken; and
 breaking means for breaking one of said first and second memory elements every time a write signal is input, so that said first memory element is broken when said first memory element is in the non-broken state, and said second memory element is broken when said first memory element is in the broken state.

2. The counting apparatus of claim 1, wherein each of said first and second memory elements is a memory element which is broken by supplying a current thereto, said breaking means including,
 i) current feed means for feeding a current only for a predetermined time every time the write signal is input,
 ii) first control means for controlling a supply of the current to said first memory element from said current feed means, such that the predetermined current is supplied to said first memory element only when said first memory element is unbroken, and
 iii) second control means for controlling a supply of the current to said second memory element from said current feed means, such that the predetermined current is supplied to said second memory element only when said first memory element is broken and said second memory element is unbroken.

3. The counting apparatus of claim 2, wherein said current feed means includes a capacitor and charging means for accumulating a predetermined amount of electric charge in said capacitor, so that said capacitor, accumulating the predetermined amount of charge, supplies current every time the write signal is input.

4. The counting apparatus of claim 2, further comprising current feed detecting means for detecting a current supply from said current feed means, and detection control means for stopping operation of said first and second detecting means until the current supply is stopped, after the current supply from said current feed means is started.

5. The counting apparatus of claim 4, wherein said current feed detecting means includes a flip-flop that is set when the current supply from said current feed means is started and is reset when the current supply is stopped, and said detection control means stops operation of said first and second detecting means when said flip-flop is set.

6. The counting apparatus of claim 2, further comprising element current detecting means for detecting a sum of currents flowing in each of said first and second memory elements when a predetermined voltage is applied to each of said first and second memory elements.

7. The counting apparatus of claim 2,
 wherein each of said first and second detecting means includes first and second detectors, said first detector of said first detecting means having a transistor that is turned ON only when said first memory element is in the non-broken state, each of said second detectors having a transistor that is turned ON only when the corresponding memory element is in the non-broken state, said first detector of said second detecting means having a transistor that is turned ON only when said transistor of said second detector of said first detecting means is in the OFF state and said second memory element is in the non-broken state; and
 each of said first and second control means supplies the predetermined current to the corresponding memory element only when said transistor of said first detector of each of said unit circuits is on the ON state.

8. The counting apparatus of claim 7, wherein said first and second memory elements are Zener diodes.

9. The counting apparatus of claim 8, wherein each Zener diode is formed by a junction between a base and an emitter of an NPN transistor.

10. A counting apparatus comprising:
 a first destructive memory element for holding data of a first level when said first memory element is in a broken state and a second level when said first destructive memory element is in a non-broken state, and
 a first detection unit, detecting whether said first destructive memory element is broken or unbroken;
 a second memory element for holding data of the first level when said second destructive memory element is in the broken state and the second level when said second destructive memory element is in the broken state, a second detecting unit, detecting whether said second destructive memory element is broken or unbroken; and a breaking unit, breaking one of said first and second destructive memory elements when a write signal is input, so that said first destructive memory element is broken when said first destructive memory element is in the non-broken state, and said second destructive memory element is broken when said first destructive memory element is in the broken state.

11. The counting apparatus of claim 10, wherein each of said first and second destructive memory elements is a memory element which is broken by supplying a current thereto, said breaking unit including, a current feeder, feeding a current for a predetermined time when the write signal is input, a first controller, controlling a supply of the current to said first destructive memory element from said current feeder, such that the predetermined current is supplied to said first destructive memory element only when said first destructive memory element is unbroken, and a second controller, controlling a supply of the current to said second destructive memory element from said current feeder, such that the predetermined current is supplied to said second destructive memory element only when said first destructive memory element is broken and said second destructive memory element is unbroken.

12. The counting apparatus of claim 11, wherein said current feeder includes a capacitor and a charger, accumulating a predetermined amount of electric charge in said capacitor, so that said capacitor, accumulating the predetermined amount of charge, supplies current when the write signal is input.

13. The counting apparatus of claim 11, further comprising a current feed detector, detecting a current supply from said current feeder, and a detection controller, stopping operation of said first and second detecting units until the current supply is stopped, after the current supply from said current feeder is started.

14. The counting apparatus of claim 13, wherein said current feed detector includes a flip-flop that is set when the current supply from said current feeder is started and is reset when the current supply is stopped, and said detection controller stops operation of said first and second detecting units when said flip-flop is set.

15. The counting apparatus of claim 11, further comprising an element current detector for detecting a sum of currents flowing in each of said first and second destructive memory elements when a predetermined voltage is applied to each of said first and second destructive memory elements.

16. The counting apparatus of claim 11, wherein each of said first and second detecting units includes first and second detectors, said first detector of said first detecting unit having a transistor that is turned ON only when said first destructive memory element is in the non-broken state, each of said second detectors having a transistor that is turned ON only when the corresponding destructive memory element is in the non-broken state, said first detector of said second detecting unit having a transistor that is turned ON only when said transistor of said second detector of said first detecting unit is in the OFF state and said second destructive memory element is in the non-broken state; and each of said first and second controllers supplying the predetermined current to the corresponding destructive memory element only when said transistor of said first detector of each of said first and second detecting units is on the ON state.

17. The counting apparatus of claim 16, wherein said first and second destructive memory elements are Zener diodes.

18. The counting apparatus of claim 17, wherein each Zener diode is formed by a junction between a base and an emitter of an NPN transistor.

* * * * *